US006451711B1

(12) United States Patent
Braddock, IV

(10) Patent No.: US 6,451,711 B1
(45) Date of Patent: Sep. 17, 2002

(54) EPITAXIAL WAFER APPARATUS

(75) Inventor: Walter David Braddock, IV, Rochester, MN (US)

(73) Assignee: Osemi, Incorporated, Rochester, MN (US)

( * ) Notice: Subject to any disclaimer, the term of this patent is extended or adjusted under 35 U.S.C. 154(b) by 0 days.

(21) Appl. No.: 09/632,650

(22) Filed: Aug. 4, 2000

Related U.S. Application Data

(60) Provisional application No. 60/201,739, filed on May 4, 2000.

(51) Int. Cl.$^7$ .............................................. H01L 21/31
(52) U.S. Cl. ..................... 438/779; 438/769; 438/763; 438/767; 438/606; 257/295; 257/310; 117/208; 117/220
(58) Field of Search ..................... 438/606, 22, 33, 438/779, 769, 236, 763, 767, 287; 257/295, 310; 117/208, 220

(56) References Cited

U.S. PATENT DOCUMENTS

| 4,416,952 A | | 11/1983 | Nishizawa ................. 428/698 |
|---|---|---|---|
| 4,561,915 A | * | 12/1985 | Mito ........................ 148/171 |
| 4,745,082 A | * | 5/1988 | Kwok |
| 4,802,180 A | * | 1/1989 | Brandle, Jr. et al. .......... 372/41 |
| 4,843,450 A | | 6/1989 | Kirschner et al. ............. 257/38 |
| 4,859,253 A | * | 8/1989 | Buchanan et al. ........... 148/33 |
| 4,935,789 A | | 6/1990 | Cabviello .................... 357/22 |
| 4,970,060 A | * | 11/1990 | Belt et al. ................... 423/593 |
| 5,055,445 A | * | 10/1991 | Belt et al. ..................... 505/1 |
| 5,124,762 A | | 6/1992 | Childs et al. ................. 357/16 |
| 5,451,548 A | * | 9/1995 | Hunt et al. |
| 5,550,089 A | | 8/1996 | Dutta et al. ................. 437/225 |
| 5,597,768 A | | 1/1997 | Passlack et al. ............ 437/236 |
| 5,665,658 A | * | 9/1997 | Passlack ..................... 438/763 |
| 5,693,565 A | * | 12/1997 | Camilletti et al. |
| 5,767,388 A | * | 6/1998 | Fleischer et al. .............. 73/31 |
| 5,821,171 A | * | 10/1998 | Hong et al. ................. 438/767 |

(List continued on next page.)

OTHER PUBLICATIONS

Passlack et. al., " Recombination velocity at oxide–GaAs interfaces fabricated by in–situ molecular beam epitaxy", Applied Physics Letters, vol. 68, No. 25, pp. 3605–3607, Jun. 17, 1997.

Passlack et. al. "Quasistatic and high frequency capacitance–vltage characterization of $Ga_2O_3$–GaAs structures fabricated by in–situ molecular beam epitaxy", Applied Physics Letters, vol. 68, No. 8, pp. 1099–1101, Feb. 19, 1996.

(List continued on next page.)

Primary Examiner—Matthew Smith
Assistant Examiner—V. Yevsikov
(74) Attorney, Agent, or Firm—Neifeld IP Law, PC

(57) ABSTRACT

A system for coating the surface of compound semiconductor wafers includes providing a single-wafer epitaxial production system in a cluster-tool architecture with a loading, storage, and transfer modules, a III–V deposition chamber, and an insulator deposition chamber. The compound semiconductor wafer is placed in the loading and transfer module and the pressure is reduced to less than $5\times10_{-10}$ Torr, after which the wafer is moved to the III–V growth chamber and layers of compound semiconductor material are epitaxially grown on the surface of the wafer. The single wafer is then moved through the transfer module to the insulator chamber and an insulating cap layer is formed by thermally evaporating molecules, consisting essentially of gallium and oxygen, from an effusion cell using a thermal evaporation source that utilizes a metallic iridium crucible that is manufactured using the electroforming process.

23 Claims, 3 Drawing Sheets

U.S. PATENT DOCUMENTS

| | | | | |
|---|---|---|---|---|
| 5,930,611 A | | 7/1999 | Okamoto | 257/410 |
| 5,945,718 A | | 8/1999 | Passlack et al. | 257/410 |
| 6,006,582 A | * | 12/1999 | Bhandari et al. | 73/23.2 |
| 6,030,453 A | * | 2/2000 | Passlack et al. | 117/104 |
| 6,045,611 A | * | 4/2000 | Ishii et al. | 117/13 |
| 6,071,780 A | | 6/2000 | Okamoto et al. | 438/287 |
| 6,094,295 A | * | 7/2000 | Passlack et al. | 359/321 |
| 6,150,677 A | | 12/2000 | Tanaka et al. | 257/201 |
| 6,207,976 B1 | | 3/2001 | Takahashi et al. | 257/192 |
| 6,313,511 B1 | | 11/2001 | Noguchi | 257/392 |

OTHER PUBLICATIONS

Ueda et. al. "Anisotropy of electrical and optical properties in B–$Ga_2O_3$ single crystals", Applied Physics Letters, vol. 71, No. 7, pp. 933–935, Aug. 18, 1997.

Ueda et. al. "Synthesis and control of conductivity of ultraviolet transmitting B–Ga2O3 single crystals", Applied Physics Letters, vol. 70, No. 26, pp. 3561–3563, Jun. 30, 1997.

\* cited by examiner

EPITAXIAL WAFER APPARATUS

This application claims benefit of provisional application No. 60/201,739.

STATEMENT REGARDING FEDERALLY SPONSORED RESEARCH

DOD Contract DAAH01-00-C-R-015 sponsored research work related to the inventions claims herein.

BACKGROUND OF THE INVENTION

1. Field of the Invention

The present invention pertains to III–V semiconductor wafer coating and manufacturing and more specifically to surface protection of III–V compound semiconductor structures.

2. Description of the Related Art

The prior art in III–V epitaxial wafer technology employs a semiconductor layer as the top layer in a compound semiconductor epitaxial layer structure including, for example GaAs, $In_{1-x}Ga_xAs$, $In_{1-y}Ga_yP$, $Al_{1-x}Ga_xAs$, InGaAsP, InSb etc., depending on the specific device/circuit application and the particular compound semiconductor substrate. The use of a semiconducting top layers in prior epitaxial wafer technology results in a semiconductor surface structure that is easily oxidized upon exposure to the atmosphere. Since the oxidization and or contamination of the top layer of the semiconductor structure occurs immediately and uncontrollably upon exposing the compound semiconductor wafer to the oxygen, water vapor, hydrocarbons, and other chemicals in the atmosphere, the physical and electronic properties of the newly oxidized semiconductor structure are altered in an uncontrollable and unpredictable manner. After such contamination and oxidization, detrimental electrical and chemical surface properties are observed in compound semiconductor structures that have detrimental effects on electronic and opto-electronic properties that negatively effect the subsequent device and integrated circuit performance. The degree of complication and degradation of a particular device or integrated circuit is subject to the particular device/circuit processing and application. For example, the fabrication and performance of unipolar Field Effect Transistor devices/circuits may be deleteriously effected by atmospheric exposure, oxygen or water vapor exposure, or oxygen plasma exposure, that leads to Fermi level pinning, and also instability of the gate-source and gate–drain regions. Since a high quality native oxide on GaAs and other III–V semiconductors cannot be formed by processes such as thermal oxidation or surface oxidation, the fabrication of useful and stable MOSFET devices has not been possible to date in GaAs or InP based semiconductors.

Uncontrollable and detrimental electrical and surface properties are caused by chemical surface reactions resulting in the formation of native oxides and dangling bonds on compound semiconductor interfaces. The surface is also rendered thermodynamically unstable after formation of the native oxide and exhibits a pinned Fermi level. More specifically, the high GaAs surface reactivity induces Fermi level pinning and surface instability after surface exposure as small as $10^5$ Langmuirs (1 Langmuir=$10^{-6}$ Torr). Surface preparation techniques conducted after exposure to air or oxygen including exposure to compounds and suspensions of sulfur and selenium, etc. have yielded compound semiconductor surfaces and interfaces that are unstable and not useful in the manufacturing of any type of GaAs integrated circuits and electronic or optoelectronic devices.

Other Prior art, U.S. Pat. No. 5,451,548, entitled "Electron Beam Deposition of Gallium Oxide Thin Films using a Single Purity Crystal Layer", issued Sep. 19, 1995, and U.S. Pat. No. 5,550,089, entitled "Gallium Oxide Coatings for Optoelectronic Devices Using Electron Beam Evaporation of a High Purity Single Crystal $Gd_3 Ga_5O_{12}$ Source", issued Aug. 27, 1996, reported that thermodynamically stable, III–V semiconductor surfaces and/or interfaces with low interface state density can be fabricated when a specific insulating cap layer is deposited in-situ on GaAs based semiconductor epitaxial layers using e-beam evaporation of $Gd_3Ga_5O_{12}$ while maintaining ultra-high vacuum (UHV). Other prior art, such as U.S. Pat. No. 6,030,453, 'III–V Epitaxial Wafer Production', issued Feb. 29, 2000 reports that gallium oxide layers on GaAs may be formed using $Ga_2O_3$ thermally evaporated from an oxide crucible fabricated from BeO and other oxide materials. However in our experience, the resulting films containing gallium and oxygen produced from thermal evaporation using a high temperature effusion cell from a BeO crucible are heavily doped with Be that is known to be an impurity and dopant in GaAs that results in unreliable devices and unreliable integrated circuits. Furthermore since the resulting Be concentration can exceed $10^{21}cm^{-3}$, the resulting gallium oxide layers produced possess residual conductivity, and thus the resulting oxide films are not insulating in nature and character. A useful protective coating for GaAs must be free of impurities at concentrations below one part in $10^{19}cm^{-3}$, and more preferably completely free of impurities at levels below 1 part in $10^{16}cm^{-3}$. Furthermore, the resulting GaAs/coating interface must be formed at extremely low pressures to limit GaAs surface exposure to <10–100 Langmuirs of various impurities while simultaneously preserving the GaAs bulk and surface stoichiometry. The process described in both patents detailing the prior art is not useful or manufacturable because the previously disclosed processes produce coating layers that are laden with impurities that render the subsequent semiconductor devices and circuits essentially non-functional or unreliable in normal operation.

Therefore, it would be highly advantageous to provide new methods of manufacturing such compound semiconductor insulator interfaces that overcome the limitations of the prior art.

It is a purpose of the present invention to provide a new and improved III–V epitaxial wafer production process that includes the placement of a useful protective, non-contaminating and passivating coating on the compound semiconductor surface.

It is another purpose of the present invention to provide a new and improved III–V epitaxial wafer with improved stability and reliability.

It is still another purpose of the present invention to provide a new and improved III–V wafer which is relatively easy to fabricate and use for semiconductor device manufacture in both the electronic and opto-electronic fields.

BRIEF SUMMARY OF THE INVENTION

The above problems and others are at least partially solved and the above purposes and others are realized in a method of coating, protecting, and passivating the surface of a compound semiconductor wafer structure including the steps of providing a compound semiconductor wafer structure with a surface and forming a truly insulating cap layer on the surface of a compound semiconductor wafer structure by thermally evaporating insulating material onto the wafer structure provided that such evaporation occurs on an atomically clean compound semiconductor surface, in an ultra high vacuum environment, and using a polycrystalline $Ga_2O_3$ that is placed in a metallic Ir crucible that is clean, outgassed at temperatures in excess of 1700° C. in a ultra high vacuum environment and conically shaped using the electro-forming process.

In this specific semiconductor production process, a single-wafer epitaxial production system is provided including, loading, transfer, and storage modules with a III–V growth chamber attached and a second insulator deposition chamber also attached to the centralized transfer module. A compound semiconductor wafer with polished surface is placed in the loading module and the pressure therein is reduced to <$10^{-6}$ Torr. The compound semiconductor wafer is moved through the transfer module to the III–V growth chamber where the base pressure is below $10^{-10}$ Torr and layers of compound semiconductor material are epitaxially grown on the surface of the compound semiconductor wafer. The compound semiconductor wafer is then moved to the transfer module and then immediately into the insulator chamber, while maintaining an ultra-high vacuum environment at all times. A subsequent insulating cap layer is formed by thermally evaporating $Ga_2O_3$ material from an electroformed Iridium crucible onto the layer topmost of compound semiconductor structure.

This deposition process is complete when a layer consisting of gallium oxygen molecules is produced with high purity and atomic abruptness on the surface of the compound semiconductor.

BRIEF DESCRIPTION OF THE DRAWINGS

Referring to the figures.

DESCRIPTION OF THE INVENTION

Figure 1:
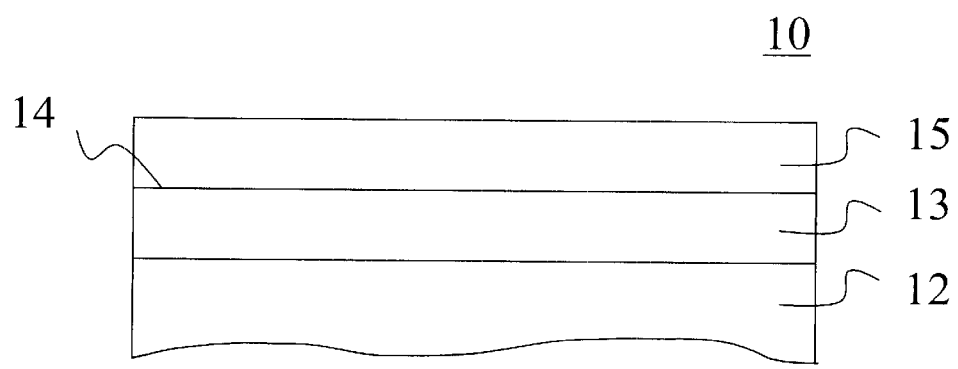
FIG. 1, illustrates a simplified cross-sectional view of a prior art compound semiconductor substrate with a native oxide formation on the surface thereof.

Referring specifically to FIG. 1, a prior art III–V compound semiconductor wafer 10 is illustrated. Wafer 10 includes a substrate with one or more layers of III–V material epitaxially formed on the upper surface thereof For purposes of this disclosure the substrate and any epitaxial layers formed thereon will be referred to simply as a compound semiconductor wafer structure, which in FIG. 1 is designated 12. Compound semiconductor wafer structure 12 has a top layer 13 with an upper surface 14. Any exposure of compound semiconductor wafer structure 12 or top layer 13 to oxygen, water vapor or ambient conditions (air, processing environments, etc.) results in a layer 15 of native oxide being formed on the surface. Generally, layer 15 is very thin, approximately 10 angstrom thick. The interface between top layer 13 and native oxide layer 15 is not atomically abrupt, and is thermodynamically unstable with a pinned Fermi level.

Figure 2:
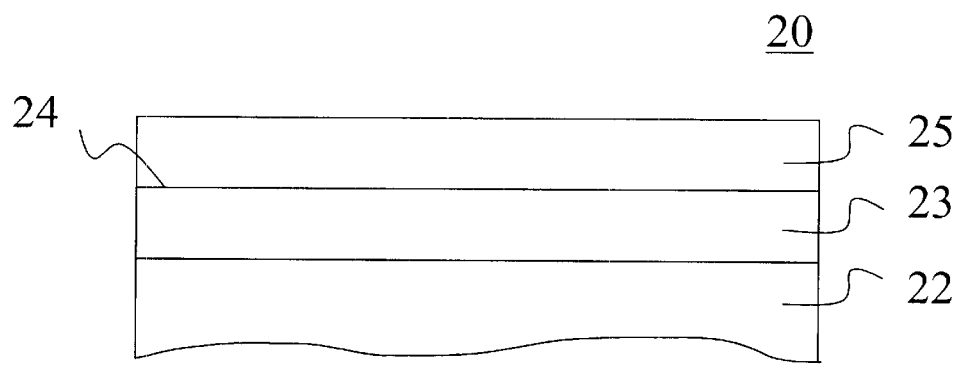
FIG. 2 illustrates a simplified cross-sectional view of a compound semiconductor substrate with epitaxial and cap layers in accordance with the present invention.

A compound semiconductor wafer structure 20 formed in accordance with the present invention is illustrated in FIG. 2. Compound semiconductor wafer structure 20 generally includes a compound semiconductor substrate with one or more layers of III–V material epitaxially formed on the upper surface thereof, hereafter designated 22. Compound semiconductor wafer structure 20 has a top layer 23 with an upper surface 24. It will of course be understood that in some specific applications (or on some portions of compound semiconductor wafer structure 20) there may be no epitaxial layers present on the substrate and upper surface 24 may simply be the upper surface of the substrate. An insulating cap layer 25 is thermally evaporated onto surface 24 of compound semiconductor wafer structure 20.

Figure 3:
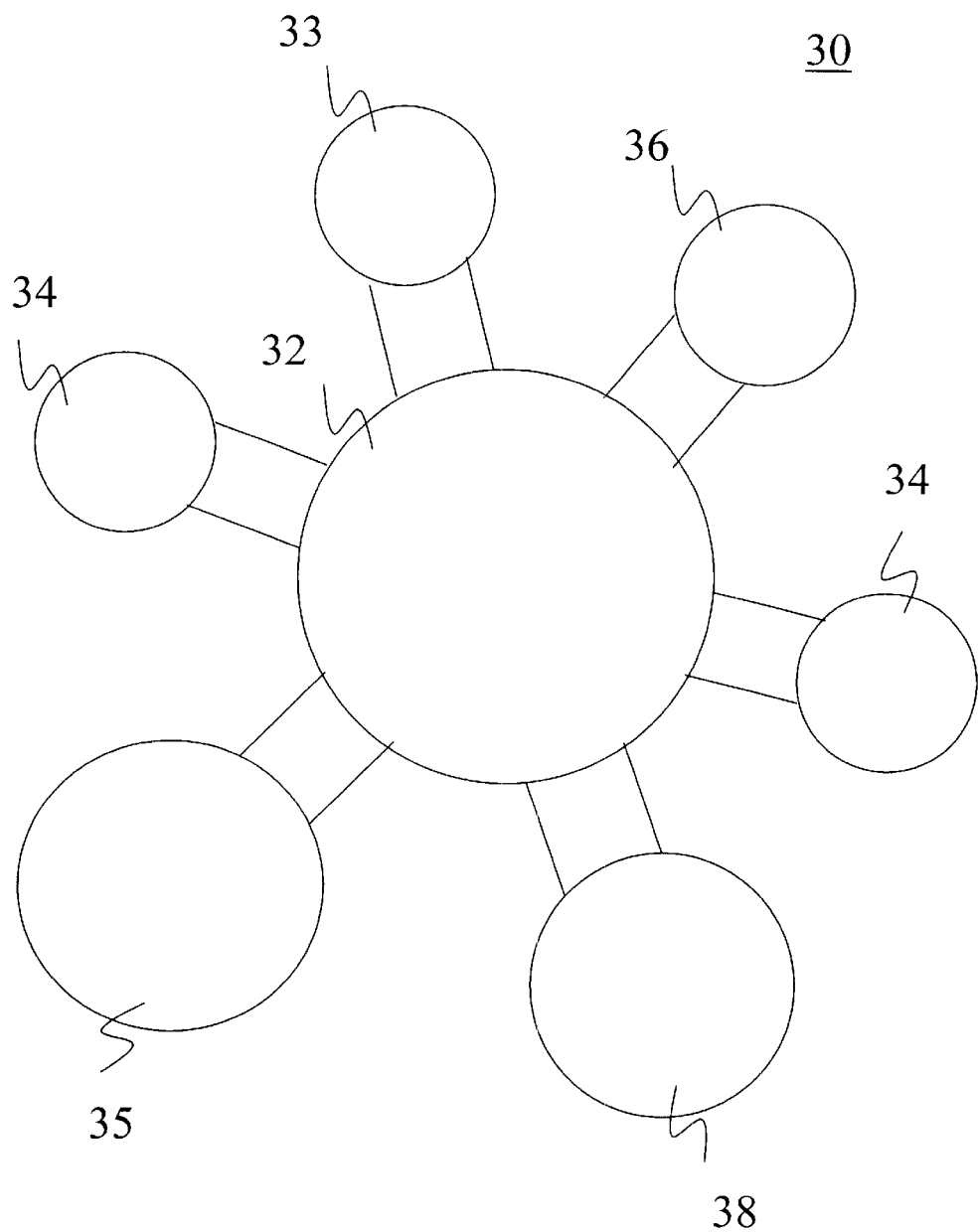
FIG. 3 illustrates a single-wafer epitaxial production system with a centralized transfer module utilized in fabricating the structure of FIG. 2 in accordance with the present invention.
Figure 4:
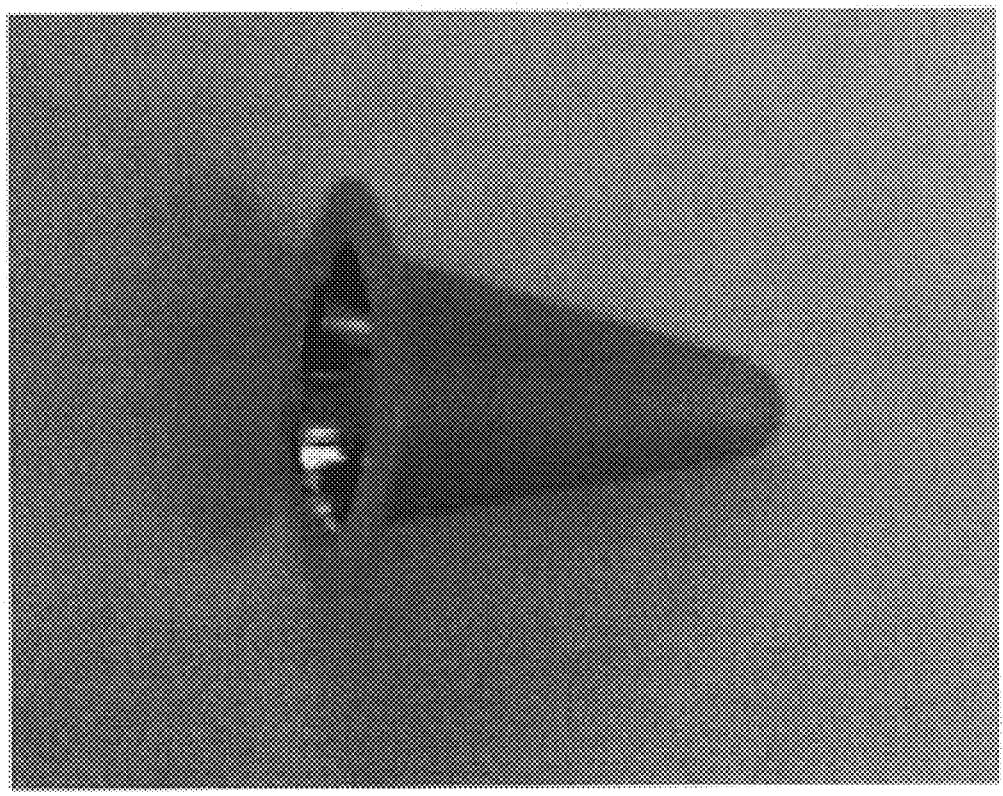
FIG. 4 is a photograph of the Iridium metal crucible that is generally of a conical shape and has one closed end and one open end and has been fabricated utilizing the electro-forming process.

Turning now to FIG. 3, a single-wafer epitaxial production system 30 is illustrated, which is utilized in fabricating compound semiconductor wafer structure 20 of FIG. 2 in accordance with the present invention. System 30 includes a loading module 33, transfer module 32, storage module 34, a III–V growth chamber 35 attached to transfer module 33, and an insulator chamber 38 attached to the transfer module 33. Each of chambers 35 and 38 are attached to transfer and load module 33 so that wafers, chips, etc. can be processed in each chamber without removing the wafers, chips, etc. from the ultra-high vacuum environment of system 30. Therefore, once a wafer is introduced into system 30 and a vacuum is drawn, the wafer is not subjected to the ambient environment or oxygen exposure until the process is completed.

Thus, as an example of a process of protecting the surface of a compound semiconductor wafer structure in accordance with the present invention, a compound semiconductor wafer is placed in loading module 31 and the pressure in loading module 31 is reduced to <$10^{-6}$ Torr. The wafer is then moved into the transfer module where the pressure is reduced to <$10^{-9}$ Torr, and then into the III–V growth chamber 35 where the base pressure is <$10^{-10}$ Torr and one or more layers of compound semiconductor material are epitaxially grown on the surface to produce a compound semiconductor wafer structure (e.g. compound semiconductor wafer structure 20). After the growth of top layer 23, compound semiconductor wafer structure 20 is moved to transfer module 33 and then to insulator chamber 38 while maintaining pressures below $5 \times 10^{-10}$ Torr. Within insulator chamber 38, insulating cap layer 25 is formed on surface 24 of compound semiconductor wafer structure 20 by thermally evaporating $Ga_2O_3$ material from an electroformed Ir crucible onto wafer structure 20.

In a preferred embodiment of the process, insulating cap layer 25 is thermally evaporated onto surface 24 of wafer structure 20 that is first formed in an atomically abrupt manner in the III–V growth chamber 35 by thermally evaporating gallium oxide molecules from an effusion cell using a thermal evaporation source in a metallic Ir crucible that is generally conical in shape and has been fabricated using the electroforming process. The evaporation source may be pure $Ga_2O_3$ or may be composed of one of several $Ga_2O_3$+rare earth element compounds or mixtures. In a second preferred embodiment the surface cotaing and protection layer that consists of primarily of gallium and oxygen compounds would be formed from the evaporation of crystalline gadolinium gallium garnet ($Ga_3Gd_5O_{12}$) from an electroformed Ir crucible. The metallic Ir crucible is generally of a conical shape, having one closed end and one open end and is fabricated using the electroforming process or chemical vapor deposition processes familiar to those skilled in the art. The crucible and effusion cell are further positioned in the insulator chamber in close proximity to the compound semiconductor wafer such that measurable deposition rates of gallium oxygen layers are achieved on the compound semiconductor structure at thermal evaporation temperatures below 1650° C. at the crucible. The deposition rate of $Ga_2O_3$ onto the compound semiconductor structure under the most preferable conditions is approximately 0.01 to 0.02 angstroms per second.

After the deposition of an insulating cap layer 25 that is composed of approximately 10 angstroms of gallium oxygen molecules the compound semiconductor wafer structure 20 is protected from exposure to ambient conditions and contamination until insulating cap layer 25 is removed. Because insulating cap layer 25 is formed in system 30 of FIG. 3, the structure or epitaxial layers are never subjected to ambient conditions and the interface between the substrate or epitaxial layers and insulating cap layer 25 is thermodynamically stable with excellent electrical properties. In the specific example of a compound semiconductor wafer structure with a GaAs surface and a layer of oxide deposited thereon, the GaAs—$Ga_2O_3$ interface exhibits abruptness within a single atomic layer and the oxide has a surface roughness <2.0 angstom (rms). Also, it has been found that there is excellent uniformity of interface state density over a fabricated wafer. The interface state density is in general comparable or better than prior art densities ($10^{10}$ $cm^{-2}eV^{-1}$).

The thermally evaporated insulating layer on the wafer structure of the disclosed process replaces the exposed semiconductor surface of prior art epitaxial products and the buried epitaxial semiconductor surface is electrically and chemically stable and exhibits excellent electrical properties. Thus, the improved compound semiconductor wafer structure fabricated in accordance with the novel surface protection process has the following advantages: excellent electrical and chemical properties, passivation and protection of the semiconductor epilayer structure and devices/circuits formed therein; stability of the excellent electronic and chemical surface properties of the semiconductor epilayer structure and devices/circuits formed therein; simplification of device/circuit processing; improved reproducibility and reliability of devices/circuits; and essential parts of the semiconductor surface are not exposed during processing, preserving electronic passivation.

These improvements essentially solve or overcome the problems of the prior art, such as poor reliability, dc electrical instability, and electrical hysterisis, and therefore provide a highly manufacturable process.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of coating a surface of a compound semiconductor wafer structure with a protective and passivating layer consisting primarily of gallium and oxygen molecules comprising:
   a. providing a compound semiconductor substrate with compound semiconductor epitaxial structure with a surface;
   b. positioning a crystalline, high purity Ga2O3 evaporation source consisting essentially of only Ga2O3 placed into a metallic Iridium crucible;
   c. forming a gallium oxygen layer on the surface of the wafer structure, by thermally evaporating gallium oxide molecules from the crystalline, high purity Ga2O3 evaporation source onto the surface.

2. The method of claim 1 wherein the step of providing the compound semiconductor wafer structure includes providing a compound semiconductor wafer with a semiconductor device formed thereon.

3. The method of claim 1 wherein the step of providing the compound semiconductor wafer structure includes providing a compound semiconductor wafer with a semiconductor integrated circuit formed thereon.

4. The method of claim 1 wherein the step of positioning a crystalline, high purity Ga2O3 evaporation source includes using a pure metallic iridium crucible that is generally of a conical shape having one closed end and one open end.

5. The method of claim 1 wherein the step of positioning a crystalline, high purity Ga2O3 evaporation source includes positioning the metallic iridium crucible in an effusion cell.

6. The method of claim 1 wherein the step of providing the compound semiconductor wafer includes providing a compound semiconductor wafer of gallium-arsenide.

7. A method of protecting a surface of a semiconductor wafer comprising:
   a. providing a single-wafer epitaxial production system including a loading module, transfer module, storage module, and unloading module with both a III–V growth chamber attached and an insulator deposition chamber attached to said transfer module;
   b. providing a compound semiconductor substrate with a surface;
   c. placing the compound semiconductor substrate in the loading module;
   d. reducing the pressure in the loading module below 10–6 Torr;
   e. moving said wafer through the transfer module in the III–V deposition chambers;
   f. reducing the pressure in said III–V deposition chamber to <10–9 Torr;
   g. epitaxially growing layers of compound semiconductor material on the surface of the compound semiconductor wafer;
   h. moving the compound semiconductor wafer to the transfer and load module and then to the insulator chamber;
   i. positioning a crystalline evaporation source comprising gallium and oxygen in the ratio Ga2O3 in a metallic Iridium crucible;
   j. forming a gallium oxygen layer on the surface of the wafer structure by thermally evaporating from said evaporation source onto the surface of the compound semiconductor wafer structure; and
   k. moving said compound semiconductor structure from the insulator chamber through the transfer chamber to the unloading module.

8. The method of claim 7 wherein the step of providing the compound semiconductor wafer includes providing a compound semiconductor wafer of gallium-arsenide (GaAs).

9. The method of claim 7 wherein the step of providing the compound semiconductor wafer includes providing a compound semiconductor wafer of indium-phosphide (InP).

10. The method of claim 7 wherein crystalline gadolinium gallium garnet, Ga3Gd5O12, is the evaporation source for gallium oxide molecules.

11. A method, comprising:
   a. providing a compound semiconductor epitaxial structure having a surface; b. positioning an evaporation source in a metallic Iridium crucible; and c. thermally evaporating essentially only gallium oxide molecules from the source onto said surface.

12. The method of claim 11 wherein said crucible has a generally conical shape.

13. The method of claim 11 wherein said step of evaporating comprises forming an interface of GaAs to Ga and O.

14. The method of claim 11 wherein said step of evaporating comprises forming an interface with a surface roughness of less than 2 Angstroms, rms.

15. The method of claim 11 wherein a temperature of said source is less 1650 degrees Centigrade during said thermally evaporating.

16. The method of claim 11 wherein said thermally evaporating comprises evaporating onto said surface at a deposition rate of less than about 0.02 Angstroms per second.

17. The method of claim 11 wherein said thermally evaporating comprises evaporating onto said surface at a rate of between about 0.01 and 0.02 Angstroms per second.

18. The method of claim 11 wherein said source comprises a rare earth element, Ga, and O.

19. A method, comprising:

a. providing a compound semiconductor epitaxial structure having a surface; and b. thermally evaporating from a source gallium oxide molecules onto said surface at a deposition rate of less than about 0.02 Angstroms per second while said source is at a temperature of less than 1650 degrees Centigrade.

20. The method of claim 19 wherein said evaporating comprises forming an interface of GaAs to Ga and O.

21. The method of claim 19 wherein said evaporating comprises forming an interface with a surface roughness of less than 2 Angstroms, rms.

22. The method of claim 19 wherein said source consists essentially of one of crystalline $Ga_2O_3$ and $Ga_3Gd_5O_{12}$.

23. The method of claim 19 wherein said source comprises a rare earth element, Ga, and O.

* * * * *